(12) United States Patent
Suzu

(10) Patent No.: US 7,054,225 B2
(45) Date of Patent: May 30, 2006

(54) SEMICONDUCTOR MEMORY DEVICE HAVING AN ADDRESS DETECTOR AND PULSE SYNTHESIZER TO PRESET DATA RECORD OUTPUT ERRORS

(75) Inventor: Takayuki Suzu, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/614,955

(22) Filed: Jul. 8, 2003

(65) Prior Publication Data
US 2004/0032779 A1 Feb. 19, 2004

(30) Foreign Application Priority Data
Jul. 8, 2002 (JP) .................................. 2002-198953

(51) Int. Cl.
*G11C 8/00* (2006.01)

(52) U.S. Cl. .............................. 365/233.5; 365/189.05; 365/230.08

(58) Field of Classification Search .................. 365/50, 365/189.08, 189.05, 194, 221, 233.5, 205
See application file for complete search history.

(56) References Cited

U.S. PATENT DOCUMENTS 6,337,810 B1 * 1/2002 Yamasaki et al. ...... 365/189.05
6,625,706 B1 * 9/2003 Campanale et al. ........ 711/167

* cited by examiner

*Primary Examiner*—Richard Elms
*Assistant Examiner*—Hien Nguyen
(74) *Attorney, Agent, or Firm*—Scully, Scott, Murphy & Presser, P.C.

(57) ABSTRACT

A semiconductor memory device includes of a plurality of sense amplifiers. The sense amplifiers are arranged in two amplifier columns. The two amplifier columns are disposed between two cell columns of cell plates. An address circuitry, an ATD circuitry, and a delay circuitry are disposed between an input pin row and the two cell columns. An ATD pulse synthesizer is disposed between the two amplifier columns and spaced a predetermined signal transmission path from the ATD and delay circuitries.

10 Claims, 7 Drawing Sheets

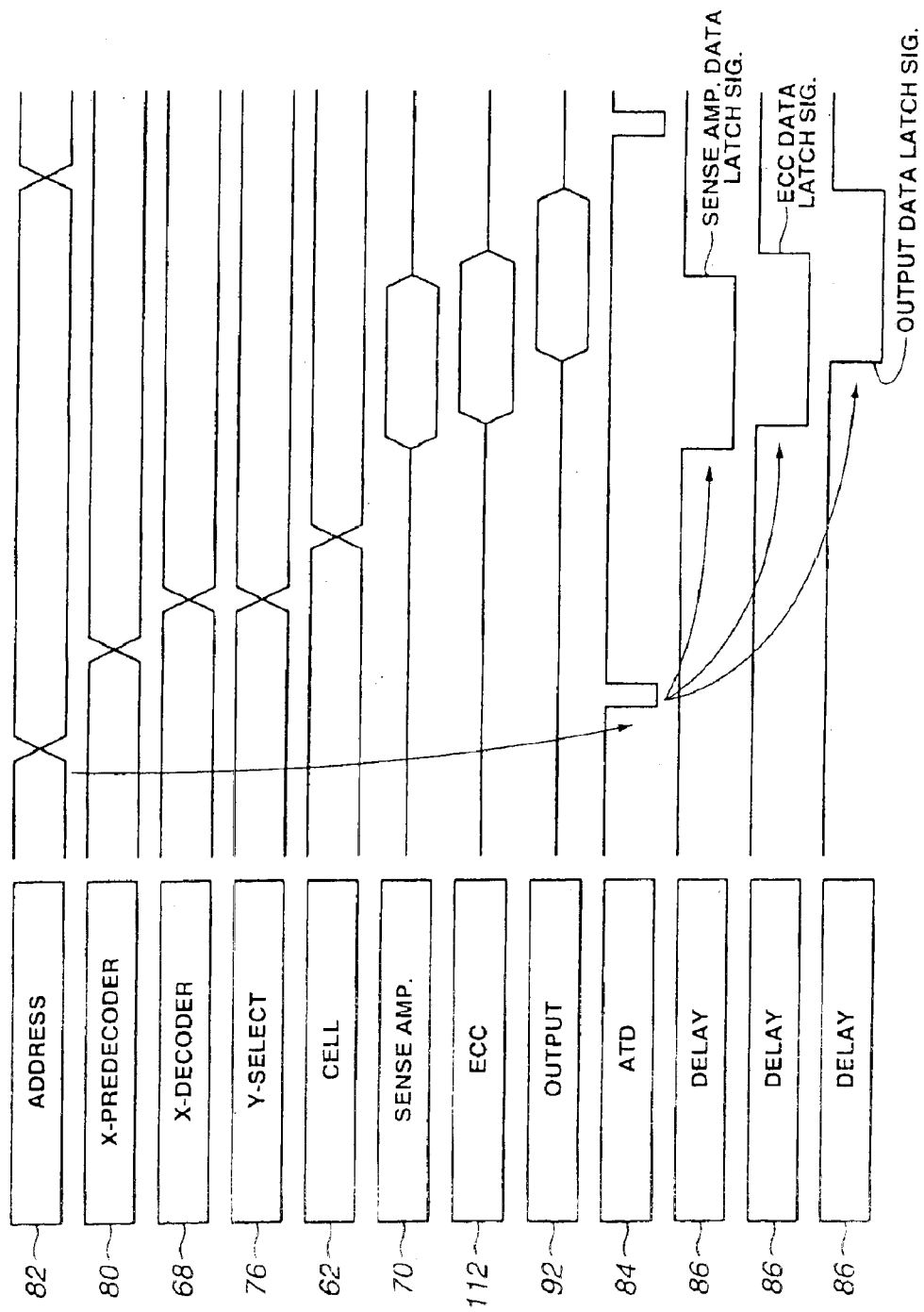

SEMICONDUCTOR MEMORY DEVICE HAVING AN ADDRESS DETECTOR AND PULSE SYNTHESIZER TO PRESET DATA RECORD OUTPUT ERRORS

BACKGROUND OF THE INVENTION

1. Field of the Invention

The present invention relates to a semiconductor memory device.

2. Description of the Related Art

Semiconductor memory devices are known, which comprise a plurality of input pins in a row, a plurality of output pins in a row, and a memory cell array. The memory cell array includes a plurality of cell plates in a single row between the input and output pin rows and decoders. A plurality of sense amplifiers are in a row between the cell row and the output pin row. An address circuitry and an address transition detector (ATD) circuitry are disposed between the input pin row and the cell row. The ATD circuitry provides an ATD pulse upon detecting a transition in the address circuitry. An ATD pulse synthesizer is disposed between the ATD circuitry and the cell row and provides a synthesized pulse in response to the ATD pulse. An output circuitry is disposed between the cell row and the output pin row. A delay circuitry provides a sense amplifier data latch signal and an output data latch signal in response to the synthesized pulse. In the known semiconductor memory devices, one of the cell plates is selected after a first delay, called "a cell select" time, based on an address data from the input pins. In response to a delayed synthesized pulse from the ATD pulse synthesizer, the delay circuitry provides latch signals to excite the sense amplifier and the output circuitries after a second delay, called "a pulse delay" time. In order to save consumption of current and maintain high speed operation, the following relationship must be maintained.

(Pulse delay time)>(Cell select time)

In the known semiconductor memory devices, it was possible to keep a memory cell transistor conductive ($I_{ON}$) to allow for the use of digit line long enough to provide the "pulse delay" time required.

High-density demands are growing in semiconductor memory devices, This tendency makes it difficult for a cell transistor to maintain performance as high as required. In order to minimize deterioration of read speed, it has been proposed to shorten the digit line and increase the number of cell plates. High expectation remains toward implementation of this proposal in semiconductor memory devices.

One approach toward realization of such semiconductor memory devices involves use of two or more word lines and two or more digit lines per each of a plurality of unit cell plates.

According to this proposed semiconductor memory device, there is no space or area for all X-predecoders to be distant substantially equally from an address circuitry, which is located near input pins. Moreover, sense amplifiers and an output circuitry cannot find any space or area near output pins so as to be substantially equally distant from an address transition detector (ATD) circuitry and an ATD pulse synthesizer. Thus, selecting a cell plate remotest from the ATD pulse synthesizer makes increasingly difficult to maintain the required relationship that (Pulse delay time)>(Cell select time).

As the amount of parasitic CR increases, the "cell select" time upon selecting the remotest cell plate may exceed the "pulse delay" time. There are proposals to cope with this problem. One proposal Is to insert a delay element into a delay circuitry. Another proposal is to use a sufficiently long signal transmission line to the delay circuitry from the ATD pulse synthesizer.

As is well known to those skilled in the art, voltage dependency, temperature dependency and VT dependency differ considerably from a capacitor element made of a transistor to a capacitor element that occurs parasitically due to signal transmission through a line. Thus, implementing the first-mentioned proposal inevitably apply a considerably great capacitor element, as a delay element, to the delay circuitry. Use of such capacitor element causes a drop in high-speed characteristic of the semiconductor memory device. Thus, there is an upper limit to increasing capacitance of a capacitor element, as the delay element, for the delay circuitry.

The second proposal mentioned before causes an increase in wiring region, resulting in an increase in chip size.

A need remains for development of a semiconductor memory device to accomplish a high read/write speed characteristic and to reduce consumption of current by preventing output of error data.

SUMMARY OF THE INVENTION

An object of the present invention is to provide a semiconductor memory device, which is free from output of error data, thus maintaining high-speed characteristic with low consumption of current.

According to one exemplary implementation of the present invention, there is provided a semiconductor memory device comprising:

an input pin row including a plurality of input pins;

an output pin row including a plurality of output pins;

a memory cell array including a plurality of cell plates in a plurality of cell columns between the input and output pin rows;

a plurality of sense amplifiers in two amplifier columns disposed between the adjacent two of the plurality of cell columns;

an address circuitry;

an address transition detector (ATD) circuitry to provide an ATD pulse upon detecting a transition in the address circuitry;

an ATD pulse synthesizer to provide a synthesized pulse in response to the ATD pulse;

an output circuitry; and a delay circuitry to provide a sense amplifier data latch signal and an output data latch signal in response to the synthesized pulse from the ATD pulse synthesizer, at least the address, ATD and delay circuitries being disposed between the input pin row and the plurality of cell columns, the ATD pulse synthesizer being disposed between the two amplifier columns and spaced a predetermined signal transmission path from the ATD and delay circuitries.

BRIEF DESCRIPTION OF THE DRAWINGS

FIG. 7 is a signal-timing diagram of the embodiment shown in FIG. 3.

DESCRIPTION OF THE EXEMPLARY EMBODIMENTS

Figure 1:
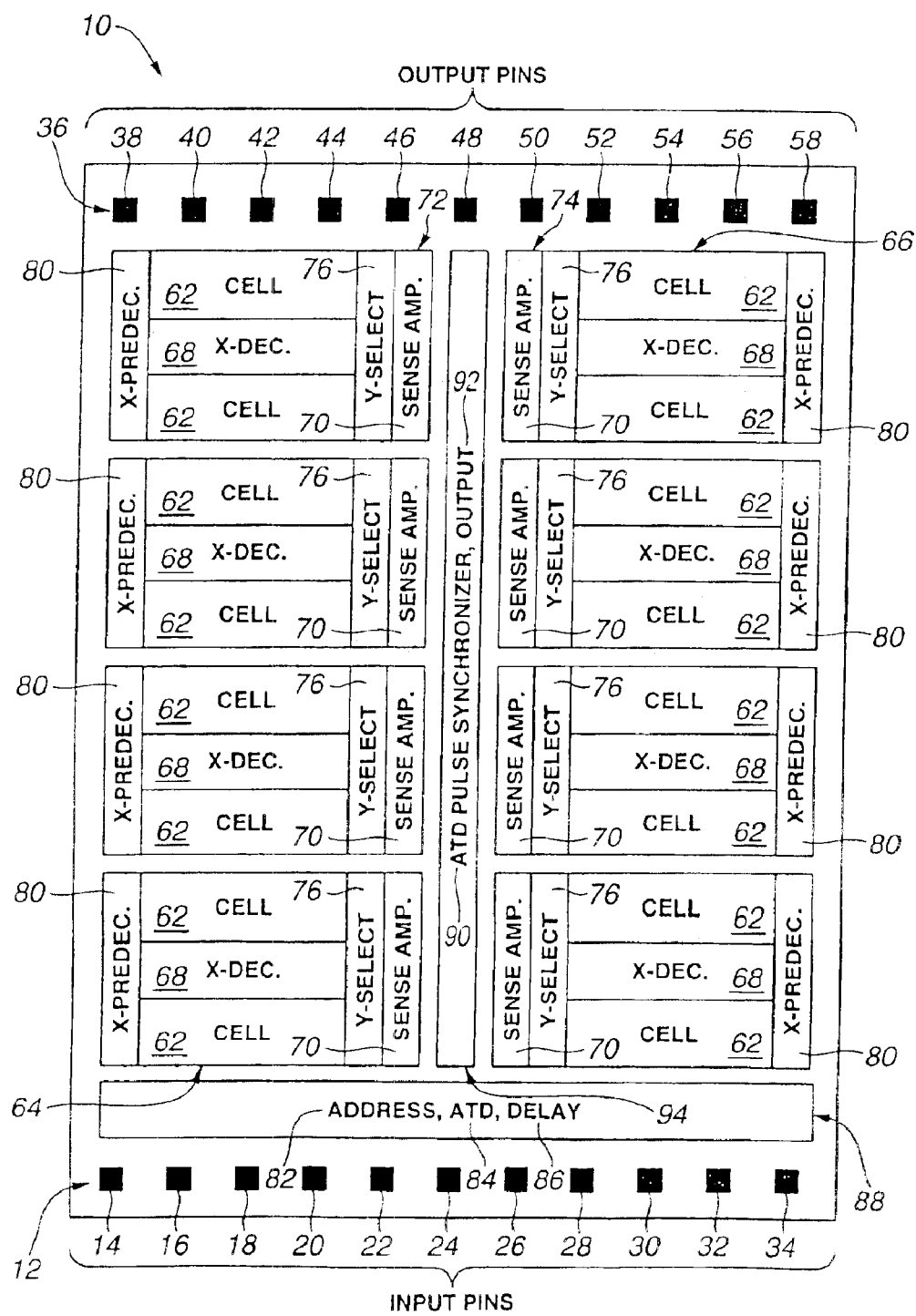
FIG. 1 is a view illustrating a chip layout of one embodiment of a semiconductor memory device according to the present invention.

Referring to the accompanying drawings, similar reference numerals are used throughout the figures to designate like or equivalent features.

Referring to FIG. 1, a semiconductor memory device is generally indicated by the reference numeral 10. One end portion of a chip, the memory device 10 includes an input pin row 12. The input pin row 12 includes a plurality of input pins 14, 16, 18, 20, 22, 24, 26, 28, 30, 32, and 34. On the opposite end of the chip, there is an output pin row 36. The output pin row 36 includes a plurality of output pins 38, 40, 42, 44, 46, 48, 50, 52, 54, 56, and 58.

Between the input and output pin rows 12 and 36, the chip has a memory cell array. Horizontal digit lines are orthogonal to vertical word lines to define sixteen (16) cell plates 62. The cell plates 62 are arranged in two cell columns 64 and 66. The two cell columns 64 and 66 are disposed between the input and output pin rows 12 and 36. Each of the cell columns 64 and 66 includes four (4) pairs of cell plates 62.

Disposed between the cell plates 62 of each pair is an X-decoder 68. On the chip, there are eight (8) X-decoders 68, each disposed between the cell plates 62 of one of the pairs.

Eight sense amplifiers 70 are arranged in two amplifier columns 72 and 74, which are disposed between the adjacent two cell columns 64 and 66. The amplifier column 72 includes four sense amplifiers 70, which are operatively coupled with the four pairs of cell plates 62 disposed in the cell column 64, respectively. Likewise, the amplifier column 74 includes four sense amplifiers 70, which are operatively coupled with the four pairs of cell plates 62 disposed in the cell column 66, respectively.

Eight Y-select circuits 76 are provided on the chip. Each Y-select circuit 76 is operatively coupled with and disposed between an inner side of the cell plates 62 of one of the plurality of pairs and the adjacent sense amplifier 70 of one of the amplifier columns 72 and 74.

Eight X-predecoders 80 are provided on the chip. Each X-predecoder 80 is operatively coupled with and disposed adjacent an outer side of the cell plates of one of the plurality of pairs.

An address circuitry 82, an address transition detector (ATD) circuitry 84 and a delay circuitry 86 are disposed, in a row 88, between the input pin row 12 and the cell columns 64 and 66. The ATD circuitry 84 provides an ATD pulse upon detecting a transition in the address circuitry 82.

An ATD pulse synthesizer 90 and an output circuitry 92 are disposed in a column 94 between the two sense amplifier columns 72 and 74. The ATD pulse synthesizer 90 provides a synthesized pulse in response to the ATD pulse. In response to the synthesized pulse, the delay circuitry 86 provides a sense amplifier data latch signal and an output data latch signal. The sense amplifier 70 is excited in response to the sense amplifier data latch signal. The output circuitry 92 is excited in response to the output data latch signal.

The ATD pulse synthesizer 90 is disposed within a central area of the chip and thus generally equally distant from the row 88 and the output pin row 36. The output circuitry 92 is disposed within an area nearest to the output pin row 36.

It is appreciated that the ATD pulse synthesizer 90 is spaced a predetermined signal transmission path from the ATD and delay circuitries 84 and 86. The ATD pulse from the ATD circuitry 84 is transmitted through a line extending along the predetermined signal transmission path to the ATD pulse synthesizer 90. The synthesized pulse from the ATD pulse synthesizer 90 is transmitted through another line along the predetermined signal transmission path.

Figure 6:
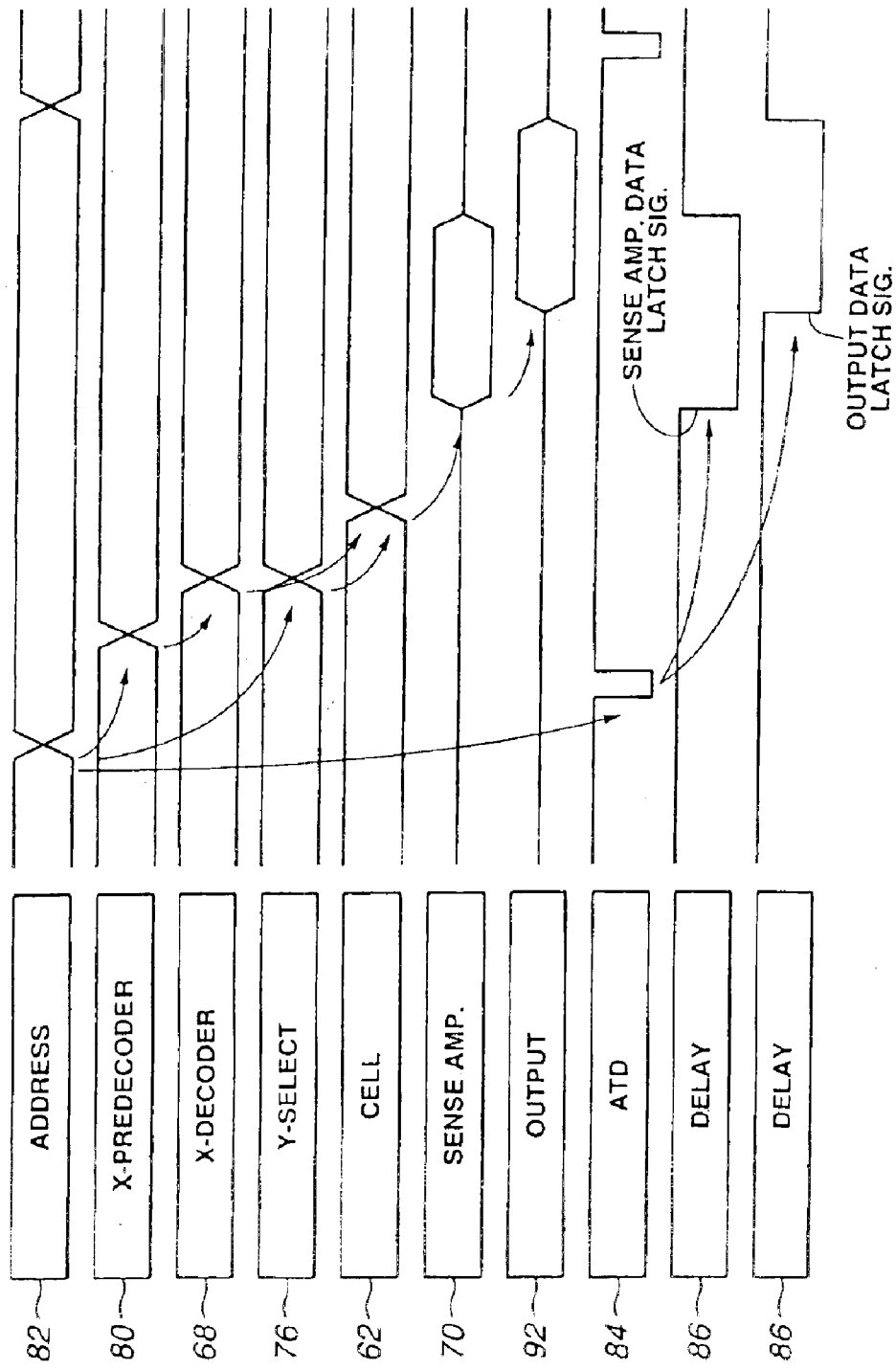
FIG. 6 is a signal-timing diagram of the embodiment shown in FIG. 1.

The signal timing diagram in FIG. 6 illustrates operation of the semiconductor memory device 10 in FIG. 1.

Address data fed to the input pins 14 to 34 is transmitted to the address circuitry 82, which provides output data. The output data from the address circuitry 82 is transmitted to the X-predecoder 80 and then to the X-decoder 68, and also to the Y-select circuit 76. In this manner, one of the cell plates 62 is selected.

The data from the selected cell plate 62 is transmitted through the Y-select circuit 76 to the sense amplifier 70. From the sense amplifier 70, the data is transmitted to the output circuitry 92. Via the output pins 38 to 58, the data is delivered externally from the semiconductor memory device 10.

The ATD circuitry 84 coupled with the address circuitry 82 provides an ATD pulse-upon detection of transition in the address circuitry 82. The ATD circuitry 84 is operatively coupled with the ATD pulse synthesizer 90. The ATD pulse synthesizer 90 provides a synthesized pulse in response to ATD pulses.

The synthesized pulse is fed to the delay circuitry 86, causing it to provide a sense amplifier data latch signal and an output data latch signal.

The sense amplifier data latch signal and the output data latch signal controls the sense amplifier 70 and the output circuitry 92 to prevent data read-output error to prevent output of error data, thus maintaining high read speed and low consumption of current.

Let us consider the case where the remotest one of the cell plates 62 is selected by an input data fed to the address circuitry 82. In this case, parasitic CR due to the transmission of pulse from the ATD circuitry 84 to the ATD pulse synthesizer 90 and the transmission of pulse back to the delay circuitry 86 ensures the relationship that (Pulse delay time)>(Cell select time). Thus, the output of error data is prevented. As a result, high-speed operation with low consumption of current can be accomplished.

Figure 2:
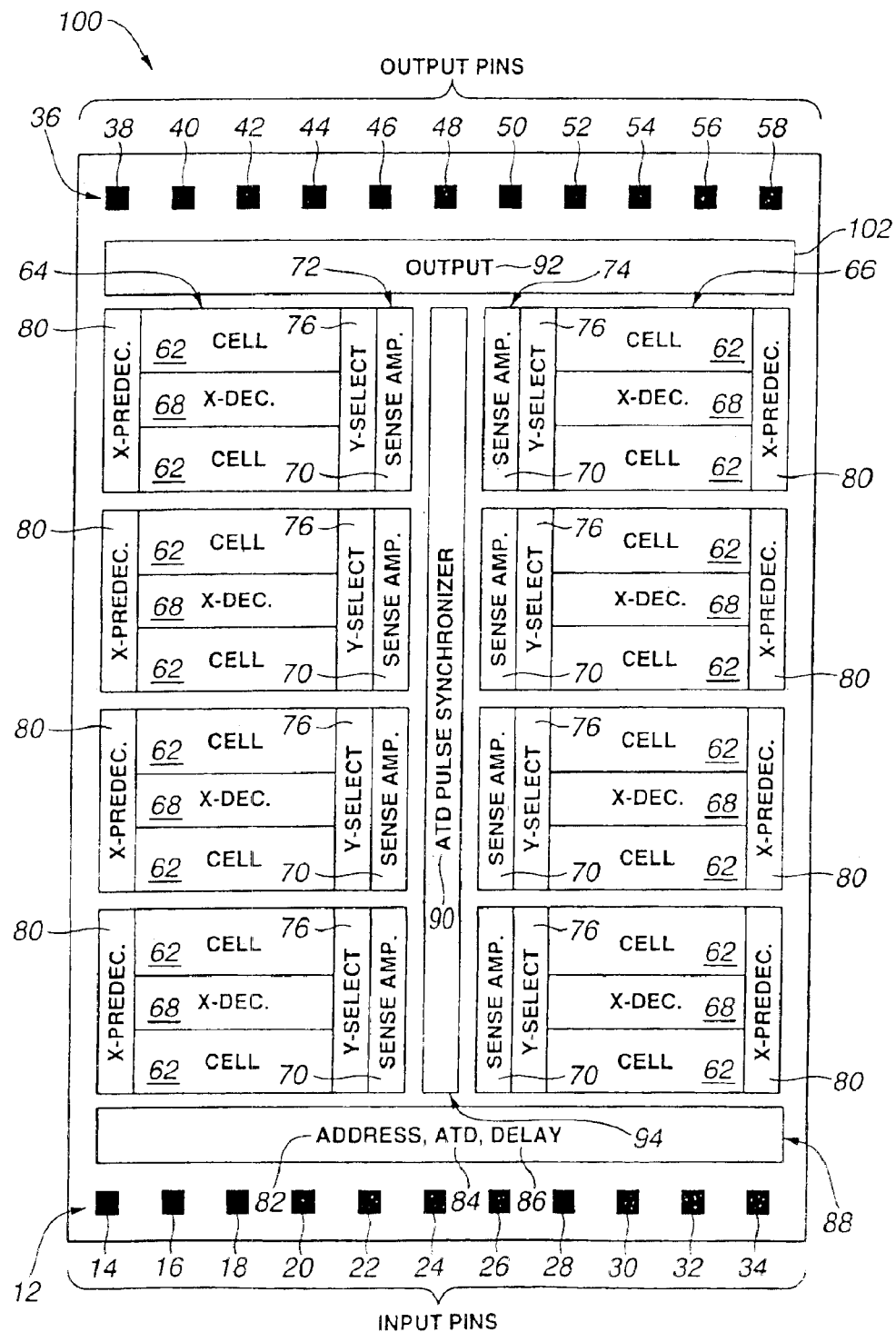
FIG. 2 is a view illustrating a chip layout of another embodiment of a semiconductor memory device according to the present invention.

With reference to FIG. 2, another embodiment of a semiconductor memory device is now designated by the reference numeral 100. The memory device 100 is substantially the same as the memory device 10 except the location of an output circuitry 92. In the memory device 100, the output circuitry 92 is disposed in a row 102 between cell columns 64, 66 and an output pin row 36.

Figure 3:
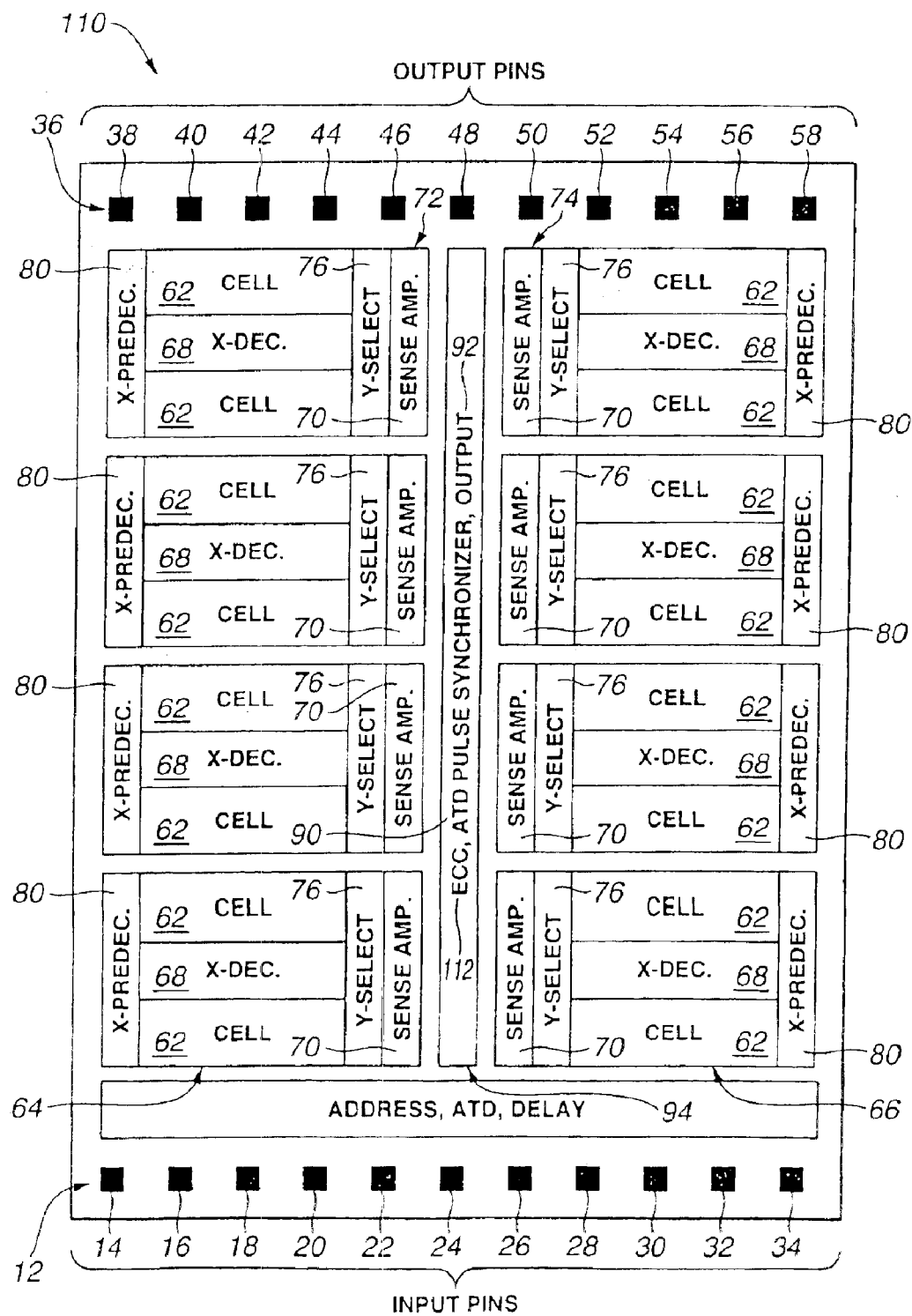
FIG. 3 is a view illustrating a chip layout of another embodiment of a semiconductor memory device according to the present invention.

With reference to FIG. 3, another embodiment of a semiconductor memory device is now designated by the reference numeral 110. The memory device 110 is substantially the same as the memory device 10 except the provision of an error correction code (ECC) circuitry 112. The ECC circuitry 112 is disposed in a column 94 between two amplifier columns 72, 74 together with an ATD pulse synthesizer 90. A delay circuitry 86 provides an ECC data latch signal also in response to the output from the ATD pulse synthesizer 90 as will be readily understood from the signal-timing diagram in FIG. 7. This signal-timing diagram is substantially the same as that in FIG. 6 except that the synthesized pulse fed to the delay circuitry 86 provides an ECC data latch signal also.

Figure 4:
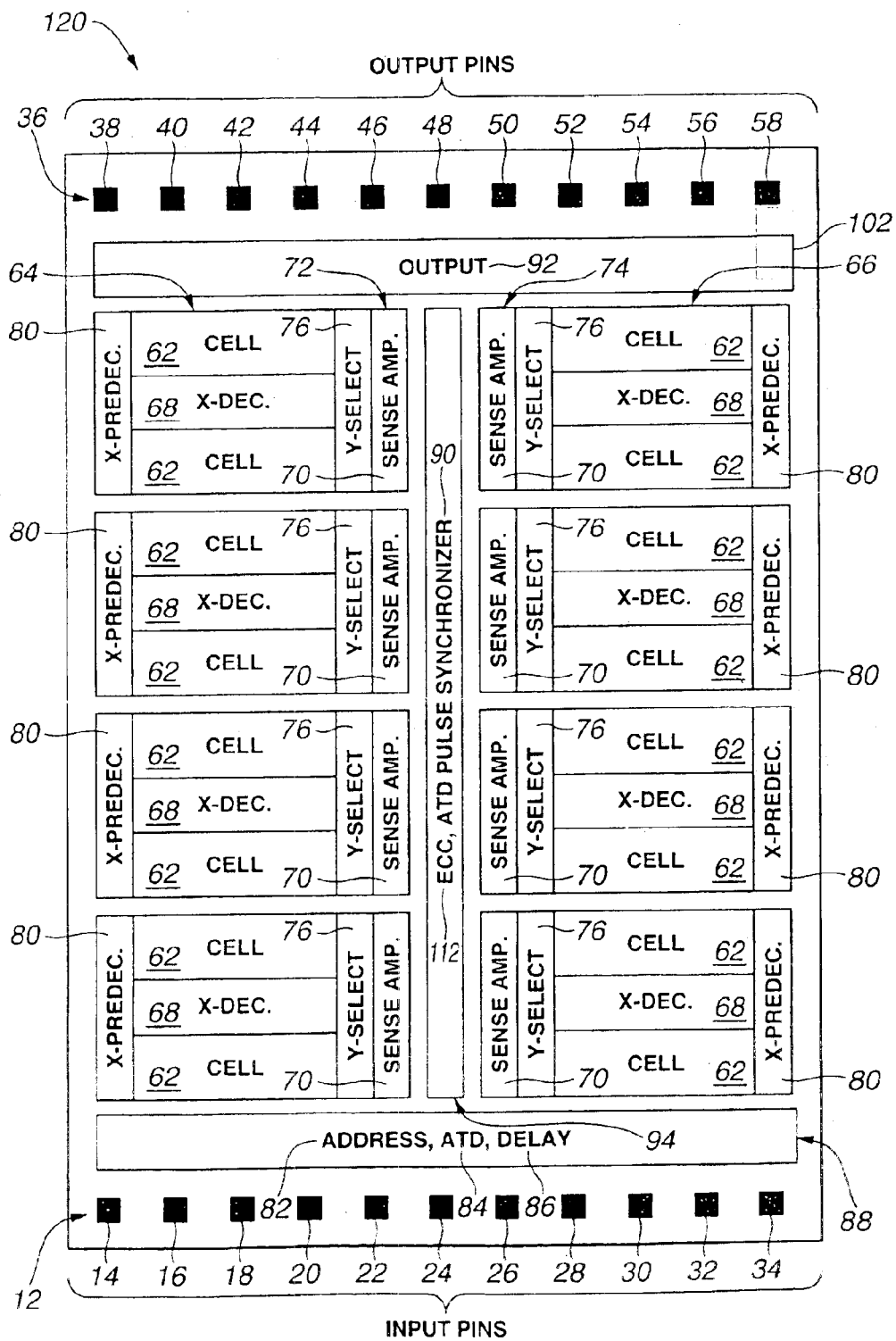
FIG. 4 is a view illustrating a chip layout of another embodiment of a semiconductor memory device according to the present invention.

With reference to FIG. 4, another embodiment of a semiconductor memory device is designated by the reference numeral 120. The memory device 120 is substantially the same as the memory device 110 except the location of an output circuitry 92. In the memory device 120, the output circuitry 92 is disposed in a row 102 between cell columns 64, 66 and an output pin row 36.

Figure 5:
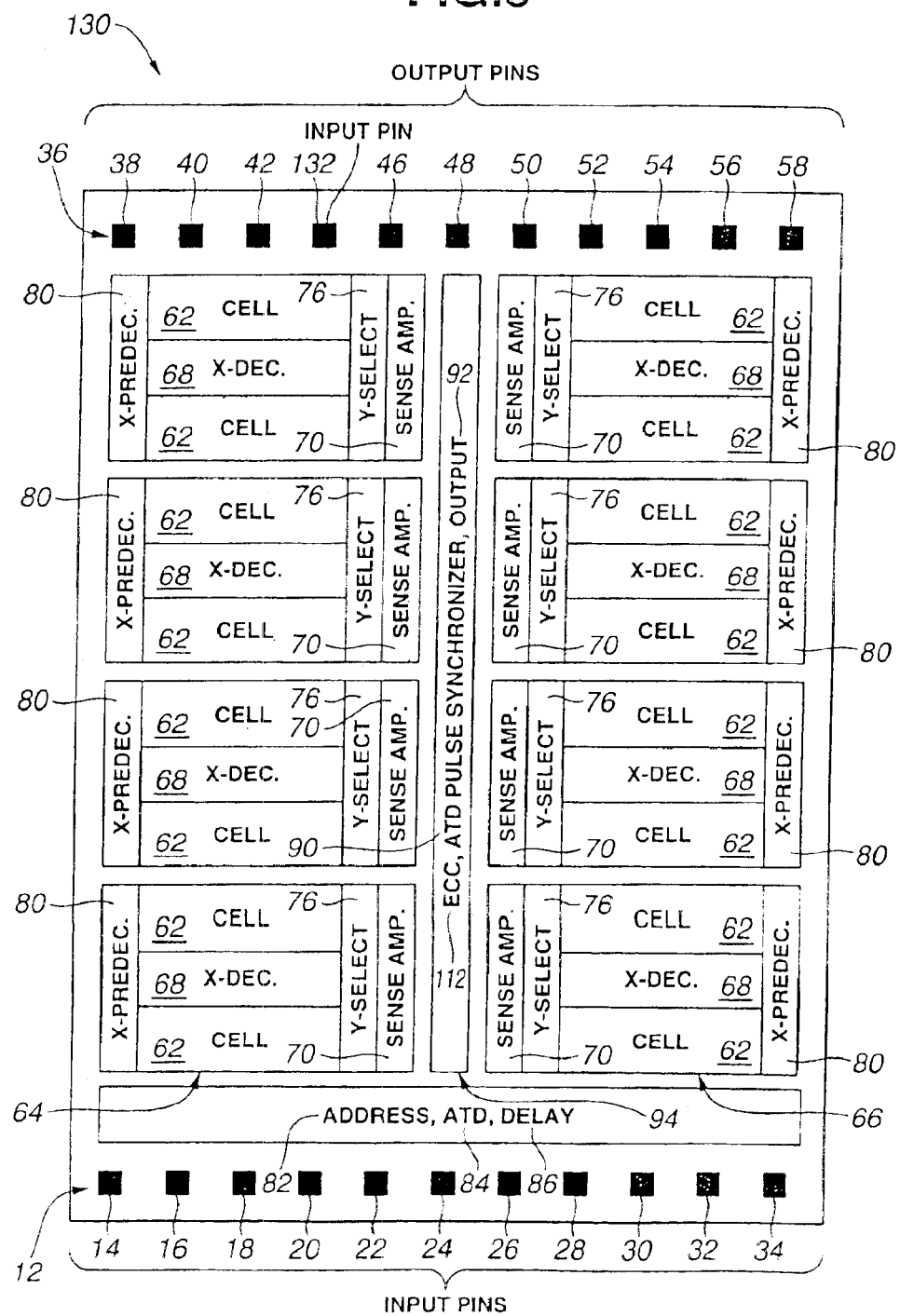
FIG. 5 is a view illustrating a chip layout of another embodiment of a semiconductor memory device according to the present invention.

With reference to FIG. 5, another embodiment of a semiconductor memory device is designated by the reference numeral 130. The memory device 130 is substantially the same as the memory device 110 in FIG. 3 except the provision of an input pin 132 within an output pin row 36.

In the embodiments, the read function is explained. However, the present invention is applicable to write function of the memory device.

In the embodiments, the memory device includes sixteen cell plates. The present invention is applicable to a memory device including four or more even number of cell plates.

While the present invention has been particularly described, in conjunction with exemplary embodiments, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

This application claims the priority of Japanese Patent Application No. 2002-198953, filed Jul. 8, 2002, the disclosure of which is hereby incorporated by reference in its entirety.

What is claimed is:

1. A semiconductor memory device comprising:
an input pin row including a plurality of input pins;
an output pin row including a plurality of output pins;
a memory cell array including a plurality of cell plates in a plurality of cell columns between the input and output pin rows;
a plurality of sense amplifiers in two amplifier columns disposed between the adjacent two of the plurality of cell columns;
an address circuitry;
an address transition detector (ATD) circuitry to provide an ATD pulse upon detecting a transition in the address circuitry:
an ATD pulse synthesizer to provide a synthesized pulse in response to the ATD pulse;
an output circuitry; and
a delay circuitry to provide a sense amplifier data latch signal and an output data latch signal in response to the synthesized pulse from the ATD pulse synthesizer,
at least the address, ATD and delay circuitries being disposed between the input pin row and the plurality of cell columns,
the ATD pulse synthesizer being disposed between the two amplifier columns and spaced a predetermined signal transmission path from the ATD and delay circuitries.

2. The semiconductor memory device as claimed in claim 1, further comprising:
an error correction code (ECC) circuitry disposed between the two amplifier columns together with the ATD pulse synthesizer, and the delay circuitry provides an ECC data latch signal.

3. The semiconductor memory device as claimed in claim 1 or 2, wherein said output circuitry is disposed between the two amplifier columns and between the ATD pulse synthesizer and the output pin row.

4. The semiconductor memory device as claimed in claim 1 or 2, wherein said output circuitry is disposed between the cell columns and the output pin row.

5. The semiconductor memory device as claimed in claim 1 or 2, wherein the device has write function.

6. The semiconductor memory device as claimed in claim 1 or 2, wherein the address, ATD and delay circuitries only are disposed in a site between the input pin row and the plurality of cell columns.

7. The semiconductor memory device as claimed in claim 1 or 2, wherein the number of the plurality of cell plates is four.

8. The semiconductor memory device as claimed in claim 1 or 2, wherein the output pin row includes at least one input pin.

9. The semiconductor memory device as claimed in claim 1 or 2,
wherein each of the plurality of cell columns include a plurality pairs of cell plates, and
further comprising;
a plurality of X-decoders, each disposed between the cell plates of one of the plurality of pairs;
a plurality of Y-select circuits, each disposed between an inner side of the cell plates of one of the plurality of pairs and the adjacent sense amplifier of one of the amplifier columns; and
a plurality of X-predecoders, each disposed adjacent an outer side of the cell plates of one of the plurality of pairs.

10. The semiconductor memory device as claimed in claim 1 or 2, wherein the memory cell array includes a plurality of horizontal digit lines, and a plurality of vertical word lines.

* * * * *